(12) United States Patent
Yamasaki et al.

(10) Patent No.: US 6,489,198 B2
(45) Date of Patent: Dec. 3, 2002

(54) SEMICONDUCTOR DEVICE AND METHOD OF MANUFACTURING THE SAME

(75) Inventors: Hideaki Yamasaki, Yamanashi (JP); Yumiko Kawano, Yamanashi (JP)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 09/812,691

(22) Filed: Mar. 21, 2001

(65) Prior Publication Data

US 2002/0027240 A1 Mar. 7, 2002

(30) Foreign Application Priority Data

Mar. 22, 2000 (JP) .................................. 2000-079642

(51) Int. Cl.$^7$ .......................................... H01L 21/8242
(52) U.S. Cl. .................. 438/253; 438/240; 438/396; 438/397; 438/254
(58) Field of Search ......................... 438/240, 250–256, 438/393–399

(56) References Cited

U.S. PATENT DOCUMENTS

| 5,641,985 A | * | 6/1997 | Tamura et al. ............... 257/209 |
| 5,851,896 A | * | 12/1998 | Summerfelt ................ 438/396 |
| 5,994,183 A | * | 11/1999 | Huang et al. ................ 257/303 |
| 6,246,082 B1 | * | 6/2001 | Mitarai et al. .............. 257/295 |
| 6,320,244 B1 | * | 11/2001 | Alers et al. ................. 257/532 |

OTHER PUBLICATIONS

Suzuki, T. et al., "Comparison of CVD–TiN, PECVD–WNx, and CVD–WSiN as Upper Electrode Materials for Ta2O5 DRAM Capacitors", Proc. Of Advanced Metallization Conference 1997, pp. 98–99, (1997).

* cited by examiner

Primary Examiner—John F. Niebling
Assistant Examiner—Jennifer M. Kennedy
(74) Attorney, Agent, or Firm—Finnegan, Henderson, Farabow, Garrett & Dunner, L.L.P.

(57) ABSTRACT

A semiconductor device includes at least one interlevel insulating film, a storage electrode, a capacitor insulating film, a plate electrode, and a protective film. The interlevel insulating film is arranged on a semiconductor substrate. The storage electrode is made of a metal material and arranged on the interlevel insulating film. The capacitor insulating film is made of an insulating metal oxide and arranged on the storage electrode. The plate electrode is made of tungsten nitride and arranged on the capacitor insulating film. The protective film is arranged on the plate electrode to suppress outward diffusion of nitrogen from the plate electrode. A method of manufacturing the semiconductor device is also disclosed.

7 Claims, 7 Drawing Sheets

SEMICONDUCTOR DEVICE AND METHOD OF MANUFACTURING THE SAME

BACKGROUND OF THE INVENTION

The present invention relates to a semiconductor device with a capacitor using tungsten nitride as a material to form an electrode, and a method of manufacturing the same.

In a dynamic random access memory (DRAM) comprised of one transistor and one capacitor, along with an increase in integration degree of the integrated circuit, it is required to increase the memory capacity by reducing the memory cell area. In this requirement, a technique has been proposed which increases the substantial area by forming a capacitor with a cylindrical or multilayered electrode structure, so that the memory capacity is increased without increasing the memory cell size.

For example, when a cylindrical capacitor structure is to be employed, a plate electrode which forms a capacitor is formed on a capacitor film having a large step. A conductor layer serving as the plate electrode to be formed on the capacitor film must be formed continuously including a step portion produced by the thickness portion of the capacitor film. Tungsten nitride, titanium nitride, ruthenium, or the like that can be formed with a good step coverage is used as the material of the conductor film, because these conductive materials can form a film by chemical vapor deposition (CVD) having a good step coverage. Among these conductive materials, tungsten nitride is superior in terms of adhesion properties and easiness to be processed to the electrode, and low leakage. Tungsten nitride is less expensive and easier to be processed to the electrode than ruthenium. Also, tungsten nitride can form a film with less damaging to an underlying capacitor film than titanium nitride.

A DRAM using above tungsten nitride will be described.

As shown in FIG. 3, a gate electrode 704 is formed on that region on a semiconductor substrate 701, which is defined by an isolation region 702 through a gate insulating film 703. Impurity regions are formed in the semiconductor substrate 701 on the two sides of the gate electrode 704 by ion implantation or the like using the gate electride 704 as a mask, thereby forming source/drain regions 705.

An interlevel insulating film 706 is formed on the gate electrode 704 over the entire surface of the semiconductor substrate 701. A contact plug 707 to be connected to the corresponding source/drain region 705 formed in the semiconductor substrate 701 is formed at a predetermined position of the interlevel insulating film 706. A bit line 708 is formed to be connected to the contact plug 707.

An interlevel insulating film 709 is formed on the interlevel insulating film 706 including the bit line 708. A contact plug 710 to be connected to the corresponding source/drain region 705 formed in the semiconductor substrate 701 is formed to extend through the interlevel insulating films 709 and 706. A storage electrode 711 is formed on the contact plug 710 through a barrier film 710a.

A capacitor insulating film 712 is formed to cover the storage electrode 711, and a plate electrode 713 made of tungsten nitride is formed to cover the storage electrode 711 and capacitor insulating film 712.

In this manner, a transistor comprised of the gate electrode 704, and a capacitor to be connected to this transistor and comprised of the storage electrode 711, capacitor insulating film 712, and plate electrode 713 make up the basic unit of the memory cell.

An interlevel insulating film 714 made of an insulator is formed also on the interlevel insulating film 709 including the plate electrode 713. Although not shown, an interconnection layer to be connected to the bit line 708 and plate electrode 713 (described above) is formed on the interlevel insulating film 714.

In the above semiconductor device, after the interlevel insulating film is formed on the plate electrode, for example, when a contact between the interconnection formed on the interlevel insulating film on the plate electrode and the silicon substrate is to be formed, high-temperature annealing at approximately 600° C. is sometimes performed. If such a high temperature is applied, cracking may occur in the plate electrode or in the worst case, the plate electrode may be peeled.

SUMMARY OF THE INVENTION

It is, therefore, the principal object of the present invention to provide a method of manufacturing a semiconductor device, by which even if a high temperature is applied in the post-process to a tungsten nitride electrode which forms a capacitor, cracking or peeling will not occur in the electrode.

In order to achieve the above object, according to the present invention, there is provided a semiconductor device comprising at least one interlevel insulating film arranged on a semiconductor substrate, a first electrode made of a metal material and arranged on the interlevel insulating film, a capacitor insulating film made of an insulating metal oxide and arranged on the first electrode, a second electrode made of tungsten nitride and arranged on the capacitor insulating film, and a protective film arranged on the second electrode to suppress outward diffusion of nitrogen from the second electrode.

DESCRIPTION OF THE PREFERRED EMBODIMENT

An embodiment of the present invention will be described with reference to the accompanying drawings.

Figure 1:
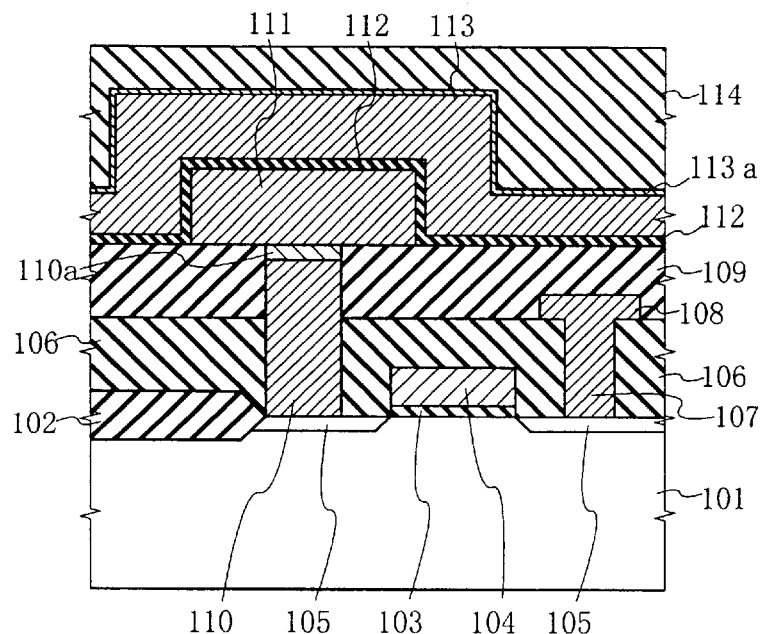
FIG. 1 is a sectional view schematically showing the arrangement of a semiconductor device according to the present invention.

FIG. 1 shows a semiconductor device according to an embodiment of the present invention. Referring to FIG. 1, a gate electrode 104 is formed on that region on a semiconductor substrate 101, which is defined by an isolation region 102 through a gate insulating film 103. In FIG. 1, impurity regions are formed in the semiconductor substrate 101 on the two sides of the gate electrode 104 by diffusion with ion implantation or the like using the gate electrode 104 as a mask, thereby forming source/drain regions 105.

An interlevel insulating film 106 is formed over the entire surface of the semiconductor substrate 101 including the gate electrode 104. A contact plug 107 to be connected to the corresponding source/drain region 105 formed in the semiconductor substrate 101 is formed at a predetermined position of the interlevel insulating film 106. The contact plug 107 is connected to a bit line 108 arranged on the interlevel insulating film 106.

An interlevel insulating film 109 is formed on the interlevel insulating film 106 including the bit line 108. A contact plug 110 to be connected to the corresponding drain/source region 105 formed in the semiconductor substrate 101 is formed to extend through the interlevel insulating films 109 and 106. A storage electrode 111 is formed on the contact plug 110 through a barrier film 110a.

A capacitor insulating film 112 is formed to cover the storage electrode 111, and a plate electrode 113 made of tungsten nitride is formed to cover the storage electrode 111 and capacitor insulating film 112. A transistor comprised of the gate electrode 104, and a capacitor to be connected to this transistor and comprised of the storage electrode 111, capacitor insulating film 112, and plate electrode 113, each of which is described above, make up the basic unit of the memory cell.

In this embodiment, a protective film 113a made of a metal suicide such as tungsten silicide is formed to cover the upper surface of the plate electrode 113. An interlevel insulating film 114 made of an insulator is formed also on the interlevel insulating film 109 including the plate electrode 113. Although not shown, an interconnection layer to be connected to the bit line 108 and plate electrode 113 (described above) is formed on the interlevel insulating film 114.

As described above, since the protective film 113a made of the metal silicide is formed on the upper surface of the plate electrode 113, even if high-temperature annealing at, e.g., 600° C. or more is performed in the post-process, cracking in the plate electrode 113 can be suppressed.

The above problem of cracking in the plate electrode is supposed to occur because, during the high-temperature annealing in the post-process, nitrogen is diffused outward from tungsten nitride that forms the plate to cause shrinkage of the plate electrode. This outward diffusion of nitrogen can be suppressed by the above protective film made of the metal silicide, so cracking or the like in the plate electrode can be suppressed. It is supposed that outward diffusion described above is suppressed in the following manner. When a metal silicide film is formed on tungsten nitride, when annealing exceeding at least 600° C. is performed, a dense thin film made of a nitride of the metal silicide is formed at the interface between tungsten nitride and the metal silicide film, thereby suppressing outward diffusion of nitrogen from the plate electrode.

A manufacturing method will be described.

Figure 2A:
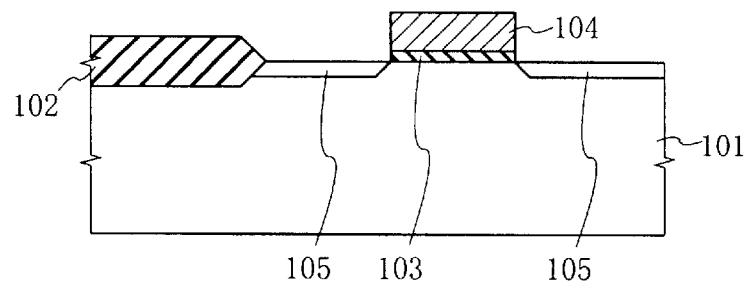
FIGS. 2A to 2L are sectional views showing the steps in a method of manufacturing the semiconductor device shown in FIG. 1.

A method of manufacturing a semiconductor device with the structure shown in FIG. 1 will be described with reference to FIGS. 2A to 2L. First, as shown in FIG. 2A, a gate electrode 104 is formed by a known method on that region on a silicon substrate 101, which is defined by an isolation region 102 through a gate oxide film 103. After the gate electrode 104 is formed, source/drain regions 105 are formed by ion implantation or the like using the gate electrode 104 as a mask.

Figure 2B:
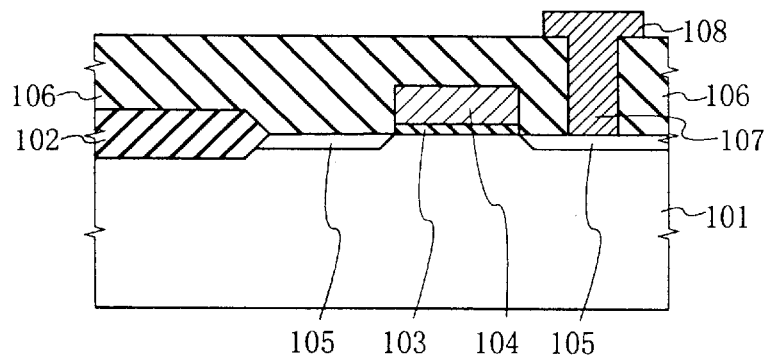

As shown in FIG. 2B, an interlevel insulating film 106 made of an insulator such as silicon oxide is formed on the entire region of the silicon substrate 101. A contact plug 107 to be connected to either one of the source/drain regions 105 formed in the semiconductor substrate 101 is formed at a predetermined position. A bit line 108 is formed to be connected to the contact plug 107.

Figure 2C:
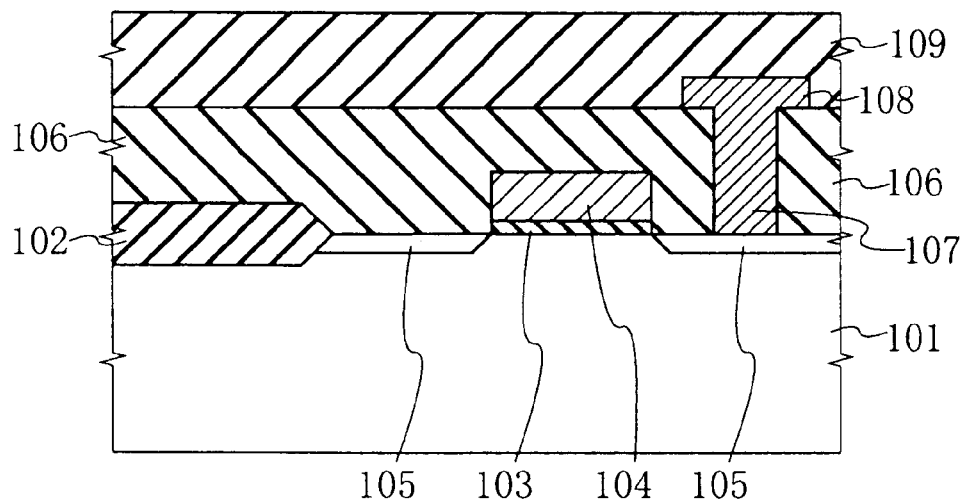
Figure 2D:
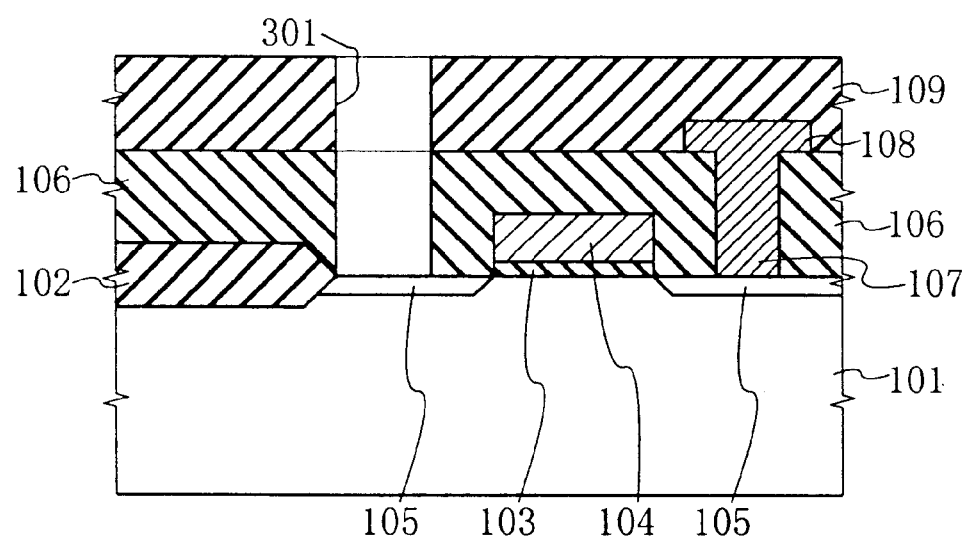

As shown in FIG. 2C, an interlevel insulating film 109 made of an insulator such as silicon oxide is formed on the interlevel insulating film 106 including the bit line 108. As shown in FIG. 2D, a contact hole 301 is formed in the interlevel insulating films 109 and 106 by the known photolithography or etching technique to reach the corresponding source/drain region 105.

Figure 2E:
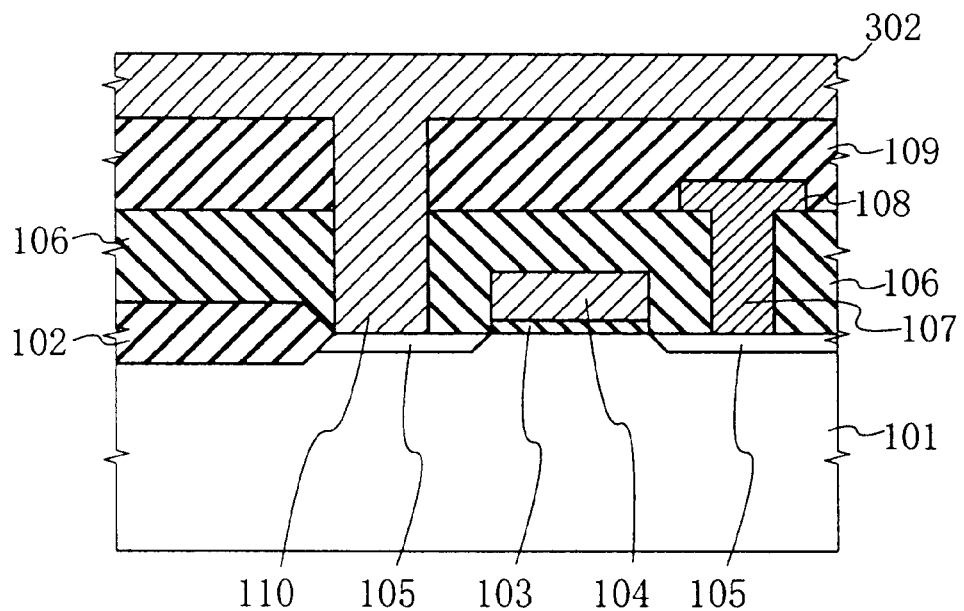

Subsequently, polysilicon is deposited on the interlevel insulating film 109 so as to fill the contact hole 301, thereby forming a polysilicon film 302 as shown in FIG. 2E. Polysilicon may be deposited by, e.g., CVD.

Figure 2F:
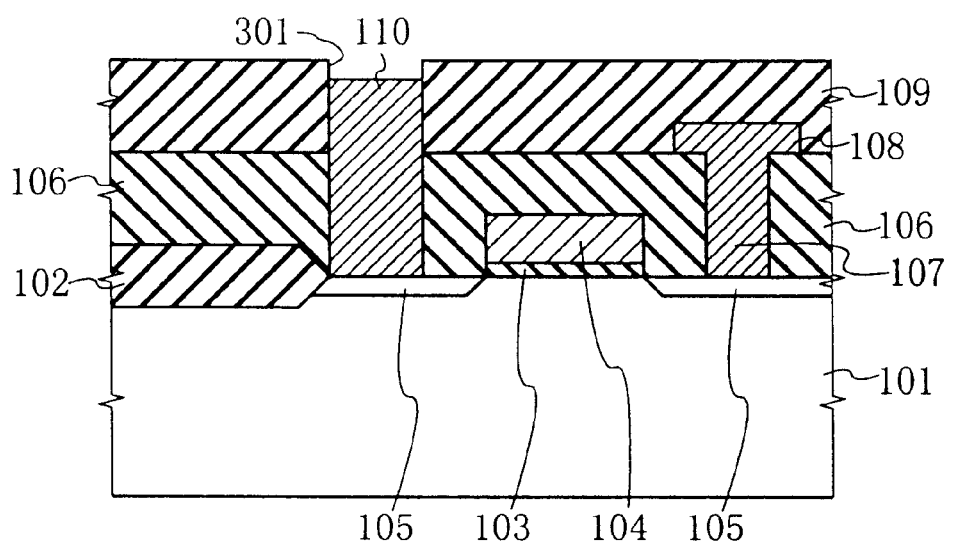

The polysilicon film 302 is selectively etched back so a contact plug 110 made of polysilicon is formed in the contact hole 301 while keeping a certain space in the upper portion of the contact hole 301, as shown in FIG. 2F. Selective etch-back of the polysilicon film 302 may be performed by reactive dry etching using an etching gas that has a selectivity with respect to silicon and does not substantially etch the interlevel insulating film 109.

Figure 2G:
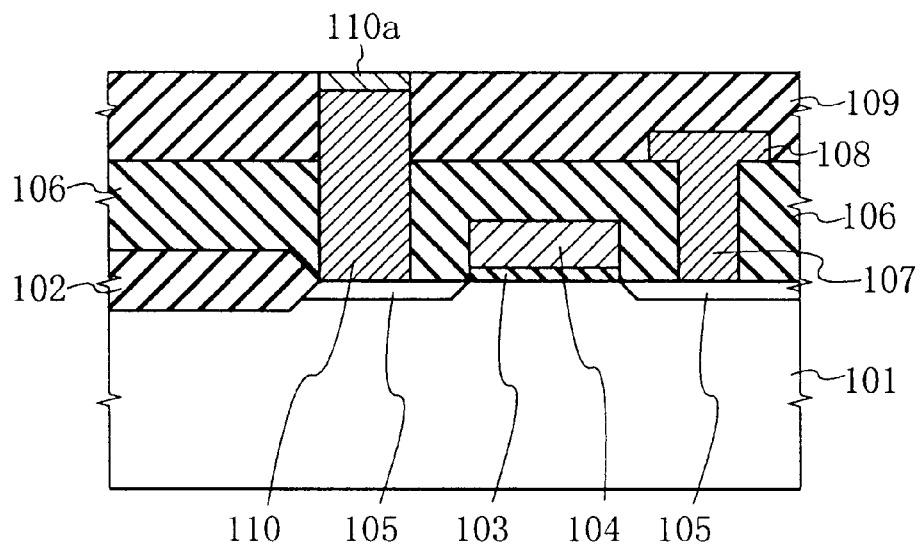

As shown in FIG. 2G, processes such as film formation and CMP or etch-back are performed to form a barrier film 110a to cover the upper surface of the contact plug 110.

Figure 2H:
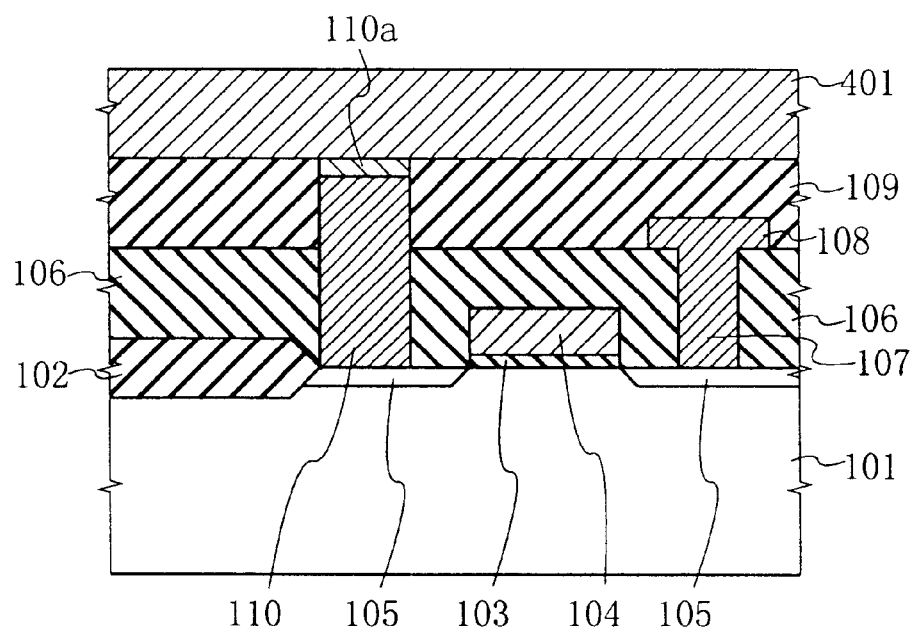

As shown in FIG. 2H, a metal film 401 made of, e.g., ruthenium, is formed on the interlevel insulating film 109 including the barrier film 110a by, e.g., sputtering or CVD, to a thickness of about 20 nm to 100 nm.

Figure 2I:
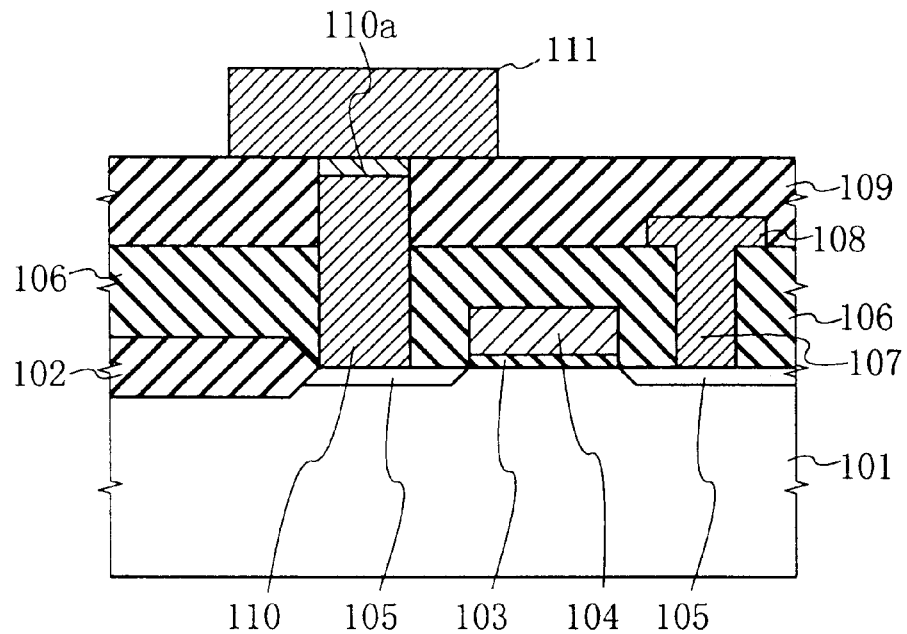

The metal film 401 is patterned by the known photolithography and etching techniques to form a storage electrode (first electrode) 111 on the interlevel insulating film 109 so as to be connected to the contact plug 110 through the barrier film 110a, as shown in FIG. 2I. The material of the storage electrode is not limited to ruthenium, but gold or platinum may also be used instead.

Figure 2J:
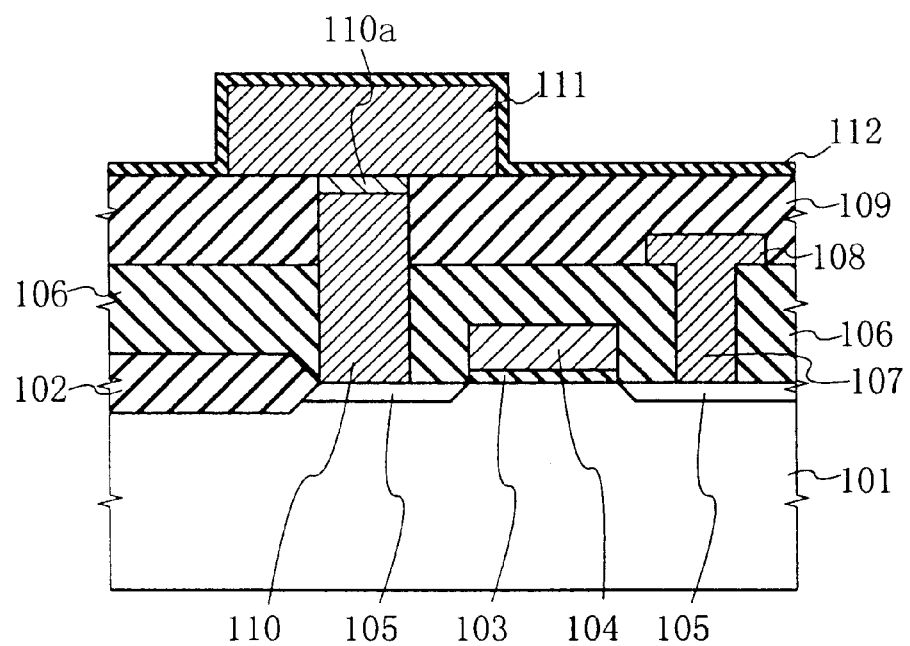

A tantalum oxide film is formed on the interlevel insulating film 109 to a thickness of about 5 nm to 20 nm to cover the storage electrode 111, and is subjected to the post-process by, e.g., annealing in an oxygen atmosphere at a temperature of approximately 500° C. to 700° C., to form a capacitor insulating film 112, as shown in FIG. 2J. The material of the capacitor insulating film is not limited to tantalum oxide, but other metal oxides may also be used instead.

Figure 2K:
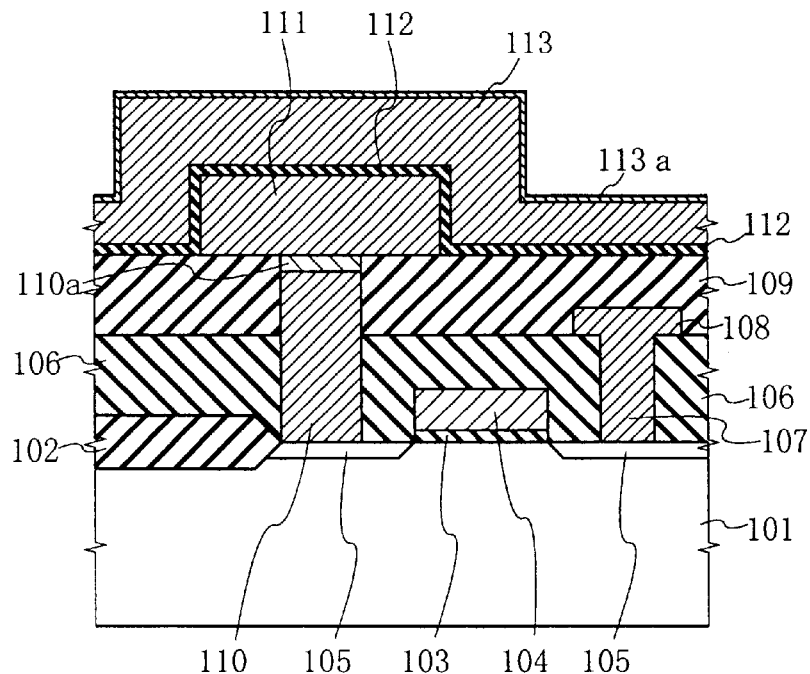
Figure 2L:
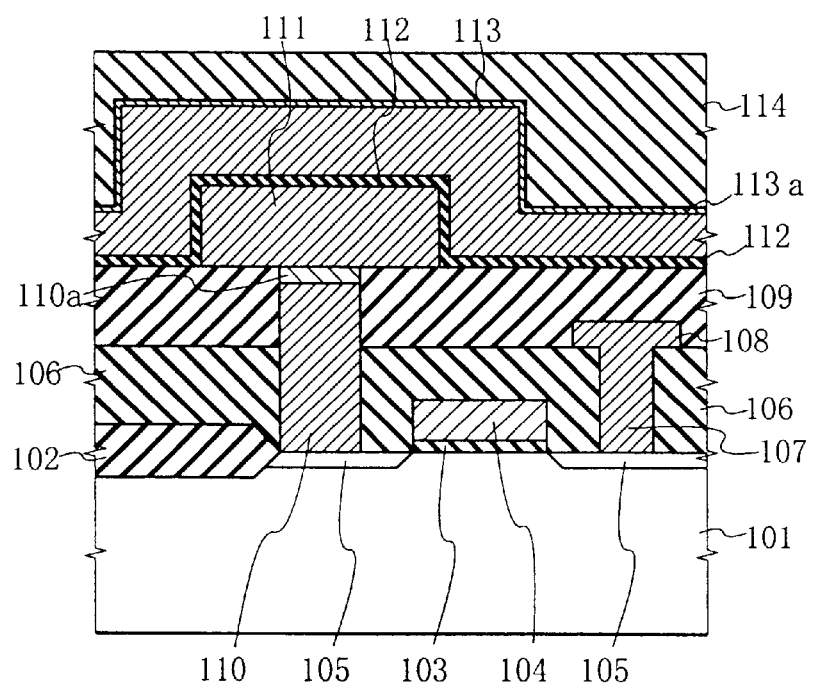
Figure 3:
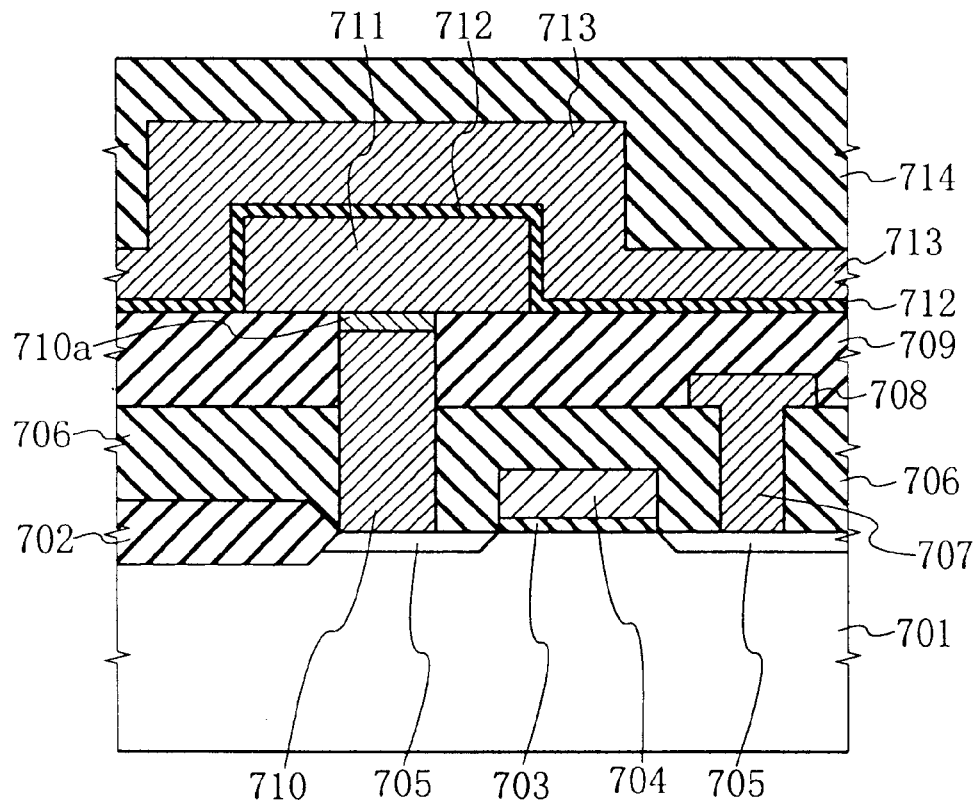
FIG. 3 is a schematical sectional view showing the arrangement of a conventional semiconductor device.

A conductive film made of, e.g., tungsten nitride, is formed on the capacitor insulating film 112 to a thickness of about 10 nm to 30 nm and, for example, a tungsten silicide film is successively formed to a thickness of about 5 nm to 20 nm. These two films are patterned by the known photolithography and etching techniques, thereby forming a plate electrode (second electrode) 113 with an upper surface being covered by a protective film 113a, as shown in FIG. 2K.

Formation of the tungsten nitride film and formation of the tungsten silicide film described above are preferably performed continuously in a single apparatus by thermal chemical vapor deposition (thermal CVD). First, using $WF_6$ as the tungsten source gas and $NH_3$ as the nitrogen source gas, and setting the substrate temperature to approximately 500° C. a tungsten nitride film is formed. Successively, using $SiH_4$, in place of $NH_3$, as the silicon source gas, tungsten silicide is formed on the formed tungsten nitride film. When film formation is continuously performed in this manner, a native insulating layer or the like will not be formed at the interface between the tungsten nitride film and tungsten silicide.

After that, an interlevel insulating film 114 made of an insulating material such as silicon oxide is formed to cover the plate electrode 113, thereby forming a 1-transistor, 1-capacitor DRAM, as shown in FIG. 6L.

In the above description, tungsten silicide is used as the material of the protective film. However, the present invention is not limited to this, and other metal silicides may be used. If a silicon nitride film is used as the protective film, the same effect can be obtained.

In the above embodiment, the capacitor electrode forms a flat plate. If the capacitor has a cylindrical or multilayered electrode structure, the present invention can be applied in the same manner as in the above embodiment. When the capacitor electrode is cylindrical, a plate electrode—capacitor insulating film—storage electrode—capacitor insulating film—plate electrode are arranged in it in this order on the side surface from the outer side. Alternatively, the capacitor can have a multilayered electrode structure. In this case, a storage electrode is sometimes arranged at the uppermost layer.

As has been described above, according to the present invention, an interlevel insulating film is formed on a semiconductor substrate, a first electrode made of a metal material is formed on the interlevel insulating film, a capacitor insulating film made of an insulating metal oxide is formed on the first electrode, a second electrode made of tungsten nitride is formed by chemical vapor deposition on the surface of the first electrode while being insulated and isolated by the capacitor insulating film, and a protective film is formed on the second electrode to suppress outward diffusion of nitrogen from the second electrode.

According to the present invention, the protective film is formed on the second electrode. After the protective film is formed, nitrogen is suppressed from being outwardly diffused from tungsten nitride that forms the second electrode, and a change in volume of the second electrode by outward diffusion of nitrogen is suppressed. As a result, according to the present invention, even if high-temperature heat is applied in the post-process to the tungsten nitride electrode that forms the capacitor, cracking or peeling the electrode can be suppressed, which is an excellent effect.

What is claimed is:

1. A method of manufacturing a semiconductor device, comprising the steps of:

forming at least one interlevel insulating film on a semiconductor substrate;

forming a first electrode of a metal material on the interlevel insulating film;

forming a capacitor insulating film of an insulating metal oxide on the first electrode;

forming a second electrode of tungsten nitride, by thermal chemical vapor deposition, on the capacitor insulating film; and suppressing outward diffusion of nitrogen from the second electrode during post-process, high temperature annealing by forming a protective film on the second electrode.

2. A method according to claim 1, wherein the protective film is made of a metal silicide.

3. A method according to claim 2, wherein the protective film is made of tungsten silicide.

4. A method according to claim 1, wherein the protective film is made of silicon nitride.

5. A method according to claim 1, wherein the protective film is formed by thermal chemical vapor deposition using at least silicon source gas.

6. A method according to claim 1, wherein a tungsten nitride film and a silicon-containing thin film are continuously formed on the semiconductor substrate on which the capacitor insulating film has been formed, and the tungsten nitride film and the silicon-containing thin film are processed to form the second electrode and the protective film.

7. The method according to claim 1, wherein the metal silicide film has a thickness in the range of from 5 to 20 nm.

* * * * *